United States Patent [19]

Schreiner

[11] 4,234,935
[45] Nov. 18, 1980

[54] MEANS FOR MAINTAINING THE IDENTIFICATION OF DEFECTIVE MINOR LOOPS IN A MAGNETIC BUBBLE MEMORY

[75] Inventor: Kenneth E. Schreiner, Saratoga, Calif.

[73] Assignee: International Business Machines Corporation, Armonk, N.Y.

[21] Appl. No.: 966,298

[22] Filed: Dec. 4, 1978

[51] Int. Cl.³ .............................................. G11C 19/08
[52] U.S. Cl. ........................................... 365/15; 365/2
[58] Field of Search ................................... 365/15, 200

[56] References Cited

U.S. PATENT DOCUMENTS

| 4,090,251 | 5/1978 | Flannigan et al. | 365/15 |
| 4,159,412 | 6/1979 | Naden et al. | 365/15 |

Primary Examiner—James W. Moffitt
Attorney, Agent, or Firm—Joseph E. Kieninger

[57] ABSTRACT

An approach for maintaining the identification of the defective minor loops of a bubble domain memory system having one or more major/minor loop arrays is disclosed. The bubble domain memory system has a plurality of minor loops for the storage of data bits including some minor loops which are defective. There is a plurality of pointers that identify the defective minor loops. At least one block of bits in each major/minor loop array is reserved for the storage of the pointers. The pointer block is associated with a fast access read/write memory, for example, a volatile random-access read/write memory system, to which the pointer information is transferred during power-on initialization of the bubble domain memory system. During the read/write operations of the bubble domain memory system, the read/write memory system enables the data positions to be skipped that correspond to the defective loops.

9 Claims, 5 Drawing Figures

TWO POINTER-BLOCK READOUT FOR MULTIPLE ARRAYS

ONE POINTER-BLOCK READOUT FOR MULTIPLE ARRAYS

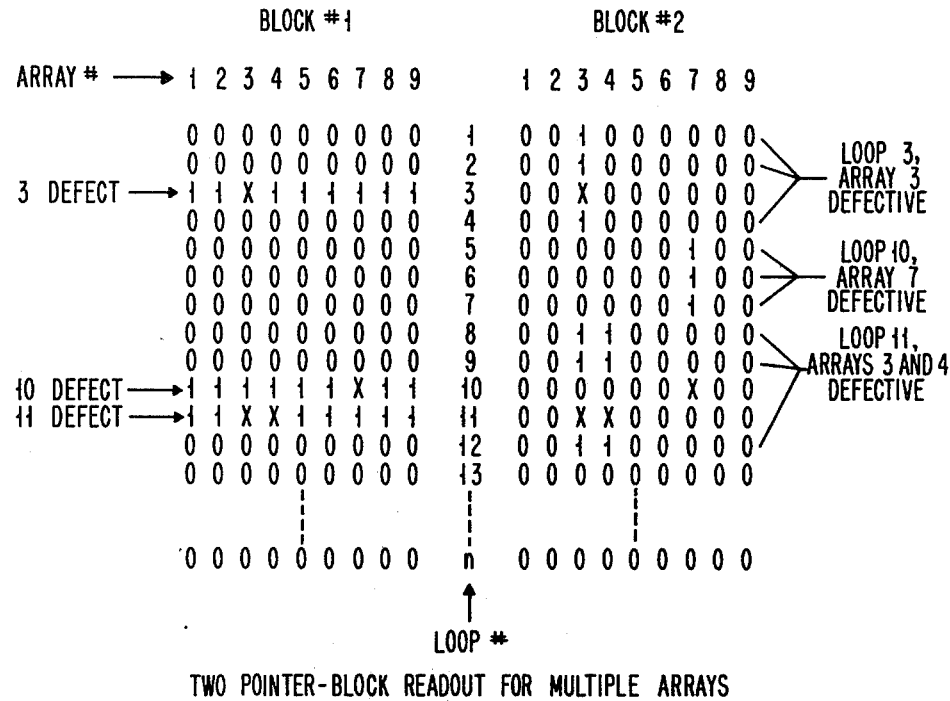
FIG. 4 — TWO POINTER-BLOCK READOUT FOR MULTIPLE ARRAYS
FIG. 5 — MULTIPLE POINTER-BLOCK READOUT FOR SINGLE ARRAY

MEANS FOR MAINTAINING THE IDENTIFICATION OF DEFECTIVE MINOR LOOPS IN A MAGNETIC BUBBLE MEMORY

DESCRIPTION

Technical Field

This invention relates to magnetic bubble memories having major/minor loop arrays and more particularly to means for maintaining the identification of defective minor loops.

It is a primary object of this invention to provide an improved major/minor loop array bubble memory system.

It is another object of this invention to provide a means for maintaining the identification of defective minor loops after manufacture and during the operation of a bubble domain memory.

It is still another object of this invention to provide means for skipping the data positions that correspond to defective minor loops.

Background Art

A widely used bubble memory organization is the major/minor loop organization in which data circulates wholly within a large number of minor loops that can be accessed via a major loop. A U.S. Pat. No. to Bonyhard et al 3,618,054 describes a magnetic domain memory utilizing a plurality of minor loops which are accessed through a single major loop. When access to a record in the minor loops is desired, the bits comprising the record are transferred from the minor loops to the major loop. The U.S. Pat. No. to Buhrer, 3,971,005, describes a major/minor loop organization having a closed major loop for writing purposes of one side of the minor loops and a second open major loop for reading purposes on the other side of the minor loops.

Although a bubble memory system employing major/minor loops of the type described has numerous economic and operational advantages, unless special provision is made, every loop and every chip of the system must be perfect for the system to perform satisfactorily. Since chips contain entire groupings of loops, a defect in one of the minor loops would require discarding the entire chip. In general, the defective minor loops are those minor loops which do not perform according to the specification and these defective minor loops can be ascertained and identified during the chip test or module test phase of production.

Various techniques have been proposed in the art for permitting use of a magnetic domain chip even though one or more of its minor loops may be defective. These techniques involve storing an appropriate map of pointers or flags to the defective loops so that the memory system can refer to it each time the memory is accessed thereafter.

The U.S. Pat. No. to Yoshimi, 3,921,156, describes providing alternate paths in a transfer loop to allow domains in the transfer loop to bypass defective loops of a plurality of minor loops. In the U.S. Pat. No. to Naden, 4,070,651, a programmable read-only memory (PROM) device is provided to permanently record locations of defective minor loops for each chip in the system. The U.S. Pat. No. to Naden et al, 3,909,810, describes a flag chip having a major/minor loop organization that is driven and data detected therefrom concurrently with the data chips to prevent faulty loops on the data chips from being read and from being used for data storage. The U.S. Pat. No. to Bogar et al, 3,792,450, describes the use of additional minor loops for containing the identification of those defective minor loops in a major/minor bubble memory.

Several of these systems must contain a unique pointer map for a given bubble module, or group of modules. This implies, for example, that a particular device will be dedicated uniquely to the pointer function for a particular memory card or system. Hence, in effect, each device must be personalized or customarized for each card on which it is installed.

BRIEF DESCRIPTION OF THE DRAWINGS

In the accompanying drawings forming a material part of this disclosure:

FIG. 4 illustrates a two pointer-block readout for the multiple array system shown in FIG. 2;

FIG. 5 illustrates a multiple pointer-block readout of a single array.

DISCLOSURE OF THE INVENTION

For a further understanding of the invention and of the objects and advantages thereof, reference will be had to the following description and accompanying drawings, and to the appended claims to which the various novel features of the invention are more particularly set forth.

An approach for maintaining the identification of the defective minor loops after manufacture and during the operation of a bubble domain memory system having one or more major/minor arrays is disclosed. The bubble domain memory system has a plurality of minor loops for the storage of data bits including some minor loops which are defective. There is a plurality of pointers that identify the defective minor loops. At least one block of bits in each major/minor loop array is reserved for the storage of pointers.

Figures 2, 3:
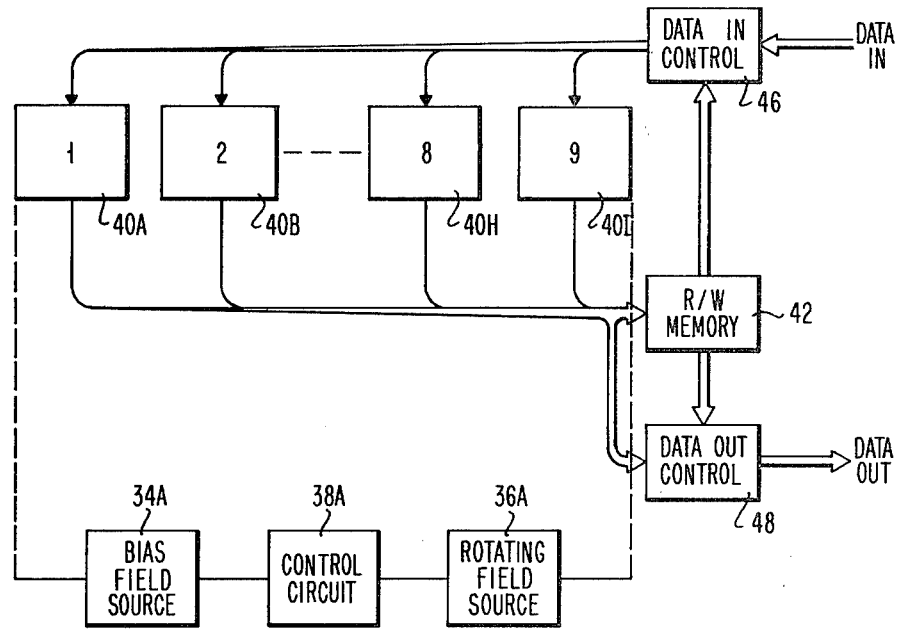
FIG. 2 is a block diagram illustration of a memory system which includes nine data chips or arrays in accordance with the present invention.
FIG. 3 illustrates one pointer-block readout for the multiple array system shown in FIG. 2.

In other words, at least one bit position per minor loop is dedicated to maintaining the identification of defective minor loops. The dedicated bit positions comprise a section of the memory which is used to hold defect pointers. This section will contain good bits as well as bad bits, which are bad due to minor-loop defects as well as other hard or soft errors. The pointers, therefore, are represented by a sufficient number of bits including excess of redundant bits in such a way that the pointer information can be extracted correctly and easily despite the aforementioned errors within the bit ensemble. Pointers may span multiple minor loop arrays, e.g., they may be byte-oriented, as illustrated in FIGS. 3 and 4. The pointers which identify defective loops within a given array may also be stored entirely within an array as shown in FIG. 5. The pointer block or blocks, is/are associated with a fast access read/write memory, for example, a volatile random-access read/write memory system, to which the pointer information is transferred during power-on initialization of the bubble domain memory system. During the read/write operations of the bubble domain memory system, the read/write memory system enables the data positions to be skipped that correspond to the defective loops.

BEST MODE FOR CARRYING OUT THE INVENTION

Figure 1:
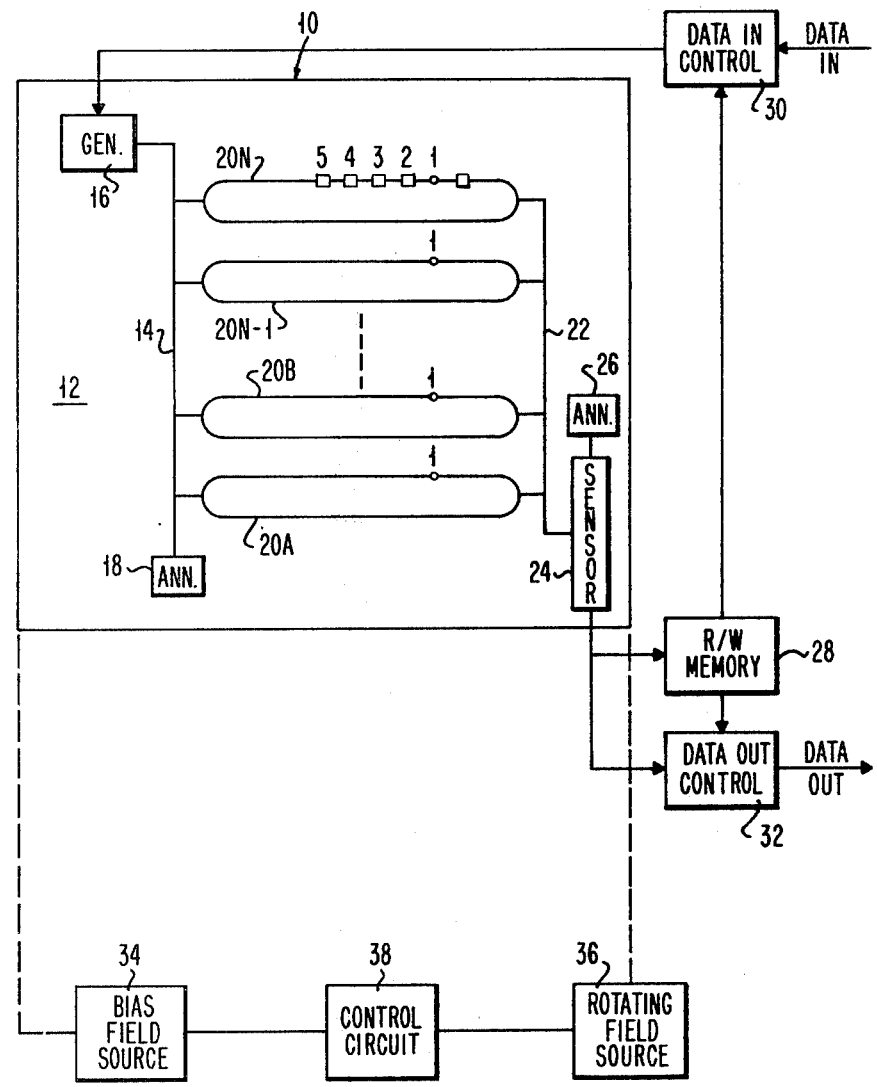
FIG. 1 is a diagram partly in block form and partly in schematic form of a data chip employed in a magnetic domain memory system in accordance with the present invention.

We first describe the means for maintaining the identification of defective minor loops in a magnetic bubble memory according to the invention. Referring to FIG. 1, the bubble array 10 is positioned on bubble chip 12 and contains an open write major loop portion 14. A generator 16 and an annihilator 18 are on each end of the major loop portion 14. A plurality of minor loops 20A, 20B . . . 20N-1 and 20N are in communication on one side thereof with the major loop portion 14. The minor loops 20A-N are connected on the other side to an open read major loop portion 22. The major loop portion 22 is connected to detector/sensor 24. The detector/sensor 24 is connected to an annihilator 26. A read/write memory 28, in accordance with this invention is connected to the detector sensor 24 with appropriate circuitry (not shown) as is known in the art. The read/write memory 28 is also connected to the data-in-control 30 means and to the data-out-control means 32 as shown. The data-in-control means 30 is connected to the generator 16 with appropriate circuitry (not shown) as is known in the art. A bias field supplied by a source 34 maintains the magnetic domains in the memory system at a desired size, while a rotating source 36 is provided for generating an in-plane magnetic field for synchronously advancing the bubble domains simultaneously around the loops and along other paths as will be described, all as is well known in this art. A control circuit 38 performs the customary function not only of controlling the rotating field, but also the read or detect and the write or generate components as will be described. It will be understood that current access can also be used instead of the magnetic field for synchronously advancing the bubble domains.

The major/minor loop array shown in FIG. 1 has n minor loops and, as a result, has n number of bits per block. The number of bit positions per loop determines the number of blocks available. During the chip test or module test phase of production, defective minor loops which do not perform according to specification can be ascertained. An appropriate map of flags or pointers to the defective loops are stored redundantly in the minor loops. For example, block position 1 in the minor loops 20A-20N can be used to store the pointers to the defective loops. One non-limiting example of how this may be effected would be to place a one in the pointer block when the minor loop is defective. If the loop is not defective, a zero would be stored in the pointer block. This will be illustrated and explained in more detail subsequently when describing FIG. 3.

The pointers that are stored in the minor loops 20A-N are copied during power-on initialization into a read/write memory 28 such as a random access memory or a shift register. Then during normal read/write operations, the copied pointers in the read/write memory 28 are referred to by digital logic in order to skip data positions that correspond to the defective loops.

One of the advantages of this system in accordance with this invention, the maintaining of the identification of defective minor loops, is accomplished at a relatively low cost since the only significant component added is a small inexpensive read/write memory such as a random access memory (RAM). In addition, the nonvolatile bad loop map may be altered easily, if necessary, since it is stored essentially in the same manner as other data in the bubble memory.

FIG. 2 illustrates a memory system which includes nine data chips 40A, 40B, . . . 40H and 40I. The major/minor loop arrays on chips 40A-40I are each connected to the read/write memory 42 and to the data-in-control means 46 and the data-out-control means 48 in the same manner as described in FIG. 1. Similarly, the read/write memory 42 is also in communication with the data-in-control means 46 and the data-out-control means 48 as previously described in FIG. 1.

FIG. 3 illustrates an example of the readout of the pointer block from the arrays on bubble chips 40A through 40I shown in FIG. 2. The pointer block is made up of one bit from each loop in the nine arrays. Each bit is derived from the same relative location in the respective loops. In FIG. 3, the first row of bits, which represents the first byte of the pointer block readout, is derived from loop #1 of each array. Loop #1 is the loop closest to the sensor element. Similarly, the second row of bits, representing the second byte of the pointer block, is derived from loop #2 of each array. All other bytes of the pointer block through byte N are read out in a similar manner. It is apparent that the bits of a byte emerge in parallel whereas the bytes emerge in serial fashion. The encoding for this block will, for example, be such that any byte which is associated with one or more faulty loops will be written as all ones while all other bytes will be written as all zeros. Upon readout, those bits which come from faulty loops will have indeterminate values, that is, they can be either ones or zeros. In FIG. 3, each faulty-loop position is represented by an "X" to indicate that the binary readout value is indeterminate.

It is evident, from this example, that the pointers have been written into the bubble memory with a greater deal of redundancy, i.e., nine ones for a pointer versus nine zeros for a non-pointer. The readout of this information, however, will be degraded for three reasons: (1) defective loops will contribute errors as explained in the preceding paragraph; (2) resident hard errors may accumulate even in non-defective loops over a period of time; and (3) additional soft errors may occur during readout. Because of these deficiencies, it is preferable to recognize a pointer by the presence of some minimum number of ones in a byte. This minimum number could be four ones, for example. In addition, the number of defective loops allowable in any one byte position would probably have to be limited to some number such as three, for example. Mistaken identification of pointers can be kept within a negligible probability by using criteria such as these.

A pointer block such as shown in FIG. 3 would be used to indicate which bytes to reject when reading a block of data bytes out of bubble chips 40A through 40I of FIG. 2. This multiple-array single-block embodiment provides simplity at the expense of efficiency, that is, many good loops are not used because of the byte-skipping characteristics.

INDUSTRIAL APPLICABILITY

FIG. 4 illustrates an example of the readout of two pointer blocks which span multiple arrays. These pointer blocks provide complete identification for all the defective loops in the arrays. Block #1 is utilized to determine the byte positions associated with defective loops in exactly the same manner as already explained in connection with FIG. 3. Block #2 provided further discrimination. It specifies the particular array for each loop position pointed to by block #1. In other words, block #1 and #2 together specify which bits are unusable when a block of data is read out of the bubble memory. Hence, it allows greater efficiency of memory utilization than the single block scheme of FIG. 3.

When block #2 is encoded, only those byte positions known to be free of defective loops as indicated by block #1 are used. A one is placed in a particular bit position to indicate a defective array. These successive bytes excluding defective bytes are coded identically for each byte identified by block #1. All other bit positions are encoded with zeros. The three-byte sequences follow consecutively in the same order as the respective pointers of block #1. Upon readout of block #2, two or more ones in a given bit position of the three-byte sequence would be presumed to be a pointer according to the coding depicted above.

The multiple-array multiple-block embodiment shown in FIG. 4 provides good efficiency, yet the coding and decoding are relatively simple.

FIG. 5 shows an example of how a single array may be encoded to provide defective-loop pointers. It is preferable to utilize at least six pointer blocks for this scheme. The illustrated case, which uses six blocks, shows that a defective loop will cause a consistent indeterminate readout at the time corresponding to the defective loop. The non-defective loop positions will be encoded so that the first three blocks contain ones and the next three contain zeros. Upon readout of all six blocks, a position which does not yield at least two ones and two zeros out of the written three-and-three will be presumed to indicate a defective loop at that position. This coding assumes that the defective loop positions are written with zeros in the first three blocks and ones in the next three and that a defective loop is as likely to convert a zero into a one as it is to convert a one into a zero. If a bias exists toward ones or toward zeros, it would be advantageous to alter the code to contrast with the existing bias. Thereby, it is possible to (a) accomplish pointer identification more reliably and/or (b) reduce the number of pointer blocks. The single-array multiple-block embodiment is suitable for small capacity stores in which only one array may be available.

In addition to the single-array multiple-block embodiment shown in FIG. 5, it is also feasible at times to use a single-array single-block embodiment. The single-array single-block embodiment is limited to cases where the number of defective loops is expected to be a very small percentage of the total number of loops.

It will be evident from the examples given in FIGS. 3, 4 and 5 that the defective-loop map can be encoded in many different ways using one or more blocks of the major/minor loop store. The choice of an optimum code for a particular storage system would depend primarily upon the array configurations, the expected number of defective loops, and their error characteristics.

The invention applies to bubble memories having a major/minor loop architecture. No extra architectural features are imposed on the physical design of the chip by the inclusion of the proposed mapping scheme. The map resides in a particular block or blocks in a form that is easy to code and decode in spite of defects and randomly-occurring errors.

In addition to the map itself, the scheme involves the use of a notch, a reference symbol stored in a particular rotational position of the bubble memory to help locate the block in which the map resides. The notch characteristic may simply be provided by uniquely coding the map to distinguish it from all other blocks. For example, referring to the embodiment illustrated by FIG. 3, the first byte of all blocks except the map block may be coded with all ones, whereas the first byte of the map block contains all zeros. A map block then will be distinguished by reading four or more zeros in the first byte of a block (defective loops and other errors are allowed to reduce the number of zeros read per byte).

One advantage of the present invention is that no change is required in the architecture of the bubble memory for inclusion of the defective-loop map. Hence, if the number of defective loops changes, the requirements on the chip design for defective-loop mapping can remain unchanged. If perfect chips are produced, the entire area can be used for data storage.

Another advantage is that this system does not require perfect memory elements to store the map. The defective-loop map occupies a section of the memory which is identical to that which stores data—hence, good as well as bad loops are included.

A further advantage of this approach is that it can be used when dealing with a single major/minor loop array or multiple arrays. In other words, the technique is flexible and adaptable to accommodate a range of different system requirements in an efficient manner.

While I have illustrated and described the preferred embodiment of my invention, it is understood that I do not limit myself to the precise constructions herein disclosed and the right is reserved to all changes and modifications coming within the scope of the invention as defined in the appended claims.

I claim:

1. A bubble domain memory system having a major/minor loop array suitable for the storage and guided movement of bubble domains, the system comprising:
   a plurality of minor loops in said array adapted for the storage of bits of data encoded as the presence or absence of bubble domains, said plurality of minor loops containing defective minor loops, a bit of data from the same position in each of said plurality of minor loops represents a block of data,
   a plurality of pointers for said plurality of minor loops that identify said defective loops,
   at least one block in said array reserved for the storage of said pointers, said pointer block and said data blocks containing a reserved portion as a notch means wherein the reserved portion includes a marker bit pattern to distinguish said pointer block from said data blocks, and
   a read-write memory system associated with said block and adapted to have the data from said block communicaed to said read-write memory system during initialization wherein during the read/write operations of said bubble domain memory said read-write memory system enables the data positions to be skipped that correspond to said defective loops.

2. A system as described in claim 1 wherein said read-write memory system is a random access memory.

3. A system as described in claim 1 wherein said read-write memory system is a shift register.

4. A system as described in claim 1 including two blocks in said array reserved for the storage of said pointers.

5. A bubble domain memory system having a plurality of major/minor loop arrays suitable for the storage and guided movement of bubble domains, the system comprising:
- a plurality of minor loops in each of said arrays adapted for the storage of bits of data encoded as the presence or absence of bubble domains, said plurality of minor loops containing defective minor loops, a bit of data from the same position in each of said plurality of minor loops in each array represents a block of data,
- a plurality of pointers for said plurality of minor loops in each array that identify said defective loops,
- at least one block in each of said arrays reserved for the storage of said pointers, said pointer block and said data blocks containing a reserved portion as a notch means wherein the reserved portion includes a marker bit pattern to distinguish said the data from said data blocks, and
- a read-write memory system associated with said blocks and adapted to have the data from said blocks communicated to said read-write memory system during initialization wherein during the read/write operations of said bubble domain memory said read-write memory system enables the data positions to be skipped that correspond to said defective loops.

6. A system as described in claim 5 wherein said read-write memory is a random access memory.

7. A system as described in claim 5 wherein said read-write memory system is a shift register.

8. A system as described in claim 5 including two blocks in each of said arrays reserved for the storage of said pointers.

9. A system as described in claim 5 including one block in each of said arrays reserved for the storage of said pointers.

* * * * *